US008624378B2

(12) United States Patent
Otremba

(10) Patent No.: US 8,624,378 B2
(45) Date of Patent: Jan. 7, 2014

(54) CHIP-HOUSING MODULE AND A METHOD FOR FORMING A CHIP-HOUSING MODULE

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 165 days.

(21) Appl. No.: 13/223,441

(22) Filed: Sep. 1, 2011

(65) Prior Publication Data

US 2013/0056877 A1    Mar. 7, 2013

(51) Int. Cl.
*H01L 23/52* (2006.01)
*H01L 23/34* (2006.01)

(52) U.S. Cl.
USPC .......................................... 257/691; 257/723

(58) Field of Classification Search
USPC .................. 257/685, 691, 723, 774, E21.499, 257/E23.001
See application file for complete search history.

(56) References Cited

U.S. PATENT DOCUMENTS

| 5,714,801 A * | 2/1998 | Yano et al. ..................... 257/691 |
| 6,967,398 B2 * | 11/2005 | Frech et al. .................... 257/691 |
| 7,378,733 B1 * | 5/2008 | Hoang et al. .................. 257/724 |

* cited by examiner

*Primary Examiner* — Hung Vu

(57) ABSTRACT

A chip-housing module including a carrier configured to carry one or more chips; the carrier including: a first plurality of openings, wherein each opening of the first plurality of openings is separated by a first pre-determined distance, and is configured to receive a chip connection for providing a voltage lying within a first range of voltage values to a chip; a second plurality of openings, wherein each opening of the second plurality of openings is separated by a second pre-determined distance, and configured to receive a chip connection for providing a voltage lying within a second range of voltage values to a chip; and wherein a pair of openings consisting of one opening of the first plurality of openings and one opening of the second plurality of openings is separated by a distance different from at least one of the first pre-determined distance and the second pre-determined distance, is provided.

22 Claims, 7 Drawing Sheets

G
Pin 1

DS
Pin 2

D
Pin 4

PS
Pin 3

510 forming a carrier for carrying one or more chips;
the carrier including a first plurality of openings, wherein each opening of the first plurality of openings is separated by a first pre-determined distance, and is capable of receiving a chip connection for providing a voltage lying within a first range of voltage values to a chip;
the carrier including a second plurality of openings, wherein each opening of the second plurality of openings is separated by the second pre-determined distance, and is capable of receiving a chip connection for providing a voltage lying within a second range of voltage values to a chip; and
wherein a pair of openings consisting of one opening of the first plurality of openings and one opening of the second plurality of openings is separated by a distance different from at least one of the first pre-determined distance x and the second pre-determined distance.

CHIP-HOUSING MODULE AND A METHOD FOR FORMING A CHIP-HOUSING MODULE

TECHNICAL FIELD

Various embodiments relate generally to a chip-housing module and a method for forming a chip-housing module.

BACKGROUND

Traditionally, high-voltage power semiconductors have been arranged in discrete housing modules, e.g. TO220-3, e.g. TO247-3, as shown in illustration 100 of FIG. 1, so as to ensure that high-voltage components are well insulated from each other. As such housings are generally very large, such practice, results in massive board space limitations for the high-voltage power semiconductor housings.

SUMMARY

An embodiment provides a chip-housing module, including a carrier configured to carry one or more chips; the carrier including a first plurality of openings, wherein each opening of the first plurality of openings is separated by a first pre-determined distance, and is configured to receive a chip connection for providing a voltage lying within a first range of voltage values to a chip; the carrier including a second plurality of openings, wherein each opening of the second plurality of openings is separated by a second pre-determined distance, and is configured to receive a chip connection for providing a voltage lying within a second range of voltage values to a chip; and wherein a pair of openings consisting of one opening of the first plurality of openings and one opening of the second plurality of openings is separated by a distance different from at least one of the first pre-determined distance and the second pre-determined distance.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5 shows a method for forming a chip-housing module.

DESCRIPTION

The following detailed description refers to the accompanying drawings that show, by way of illustration, specific details and embodiments in which the invention may be practiced.

A multi-chip module (MCM) for housing high-voltage power semiconductors is needed, to increase the integration density of power semiconductors in high-voltage applications. High-voltage applications may include high-voltage components e.g. AC/DC converters, motor drivers, power factor correction devices and switch mode power supplies SMPS.

Multi-chip modules may be used to house a plurality of discrete components, e.g. high-voltage chips. The high-voltage chips may be in electrical connection with each other, e.g. chips which may be connected in a half-bridge configuration, e.g. chips which may be connected in a full-bridge configuration.

Figure 1:
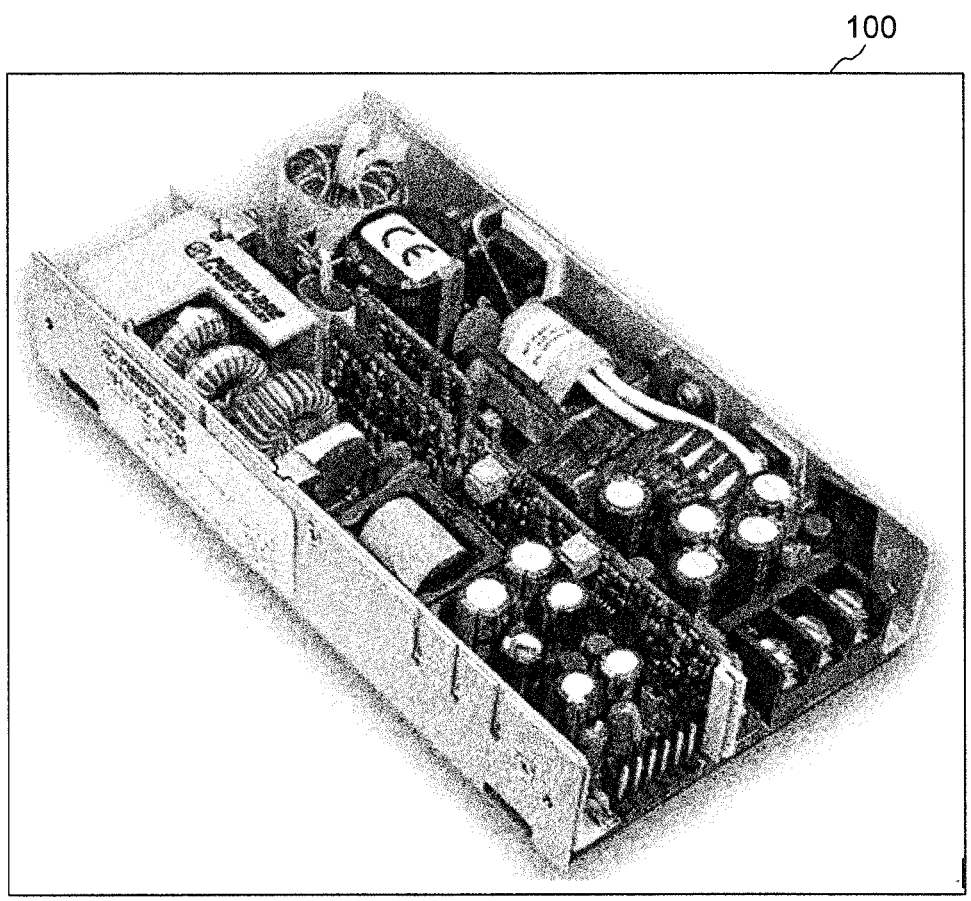
FIG. 1 shows a housing for high-voltage chips.
Figure 2A:
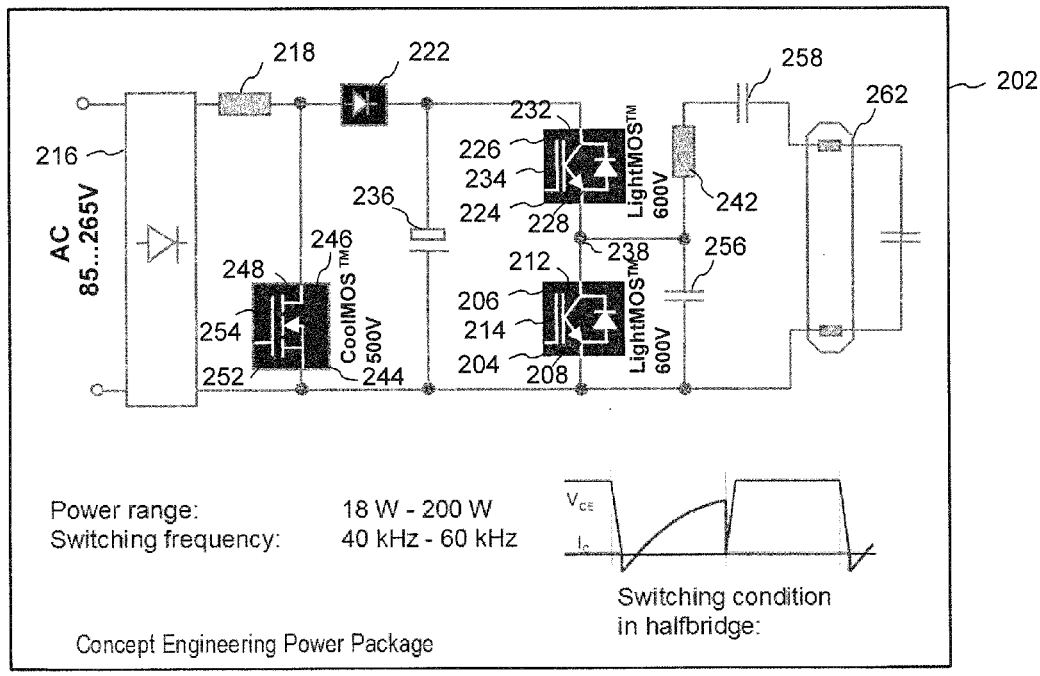
FIG. 2A shows a high voltage application lamp ballast circuit.

Illustration 200 of FIG. 2A shows according to an embodiment, a high voltage application such as a lamp ballast circuit 202 including a half-bridge architecture. Lamp ballast circuit 202 may include a plurality of chips, e.g. 204, 224, 244. Each of the plurality of chips may include a high-voltage transistor, e.g. a CoolMOS™ 500V transistor, e.g. a LightMOS™ 600V transistor. Lamp ballast circuit 202 may include a plurality of chips, e.g. a first chip 204 and a second chip 224 electrically connected, e.g. electrically connected in a half-bridge configuration, e.g. electrically connected in a full-bridge configuration.

First chip 204 may include a first transistor 206 formed in first chip 204, first transistor 206 including a first terminal 208, e.g. a first source/drain terminal, a second terminal 212, e.g. a second source/drain terminal, and a third terminal 214, e.g. a gate terminal.

Second chip 224 may include a second transistor 226 formed in second chip 224, second transistor 226 including a first terminal 228, e.g. a first source/drain terminal, a second terminal 232, e.g. a second source/drain terminal, and a third terminal 234, e.g. a gate terminal.

Lamp ballast circuit 202 may include a third chip 244. Third chip 244 may include a third transistor 246 formed in third chip 244, third transistor 246 including a first terminal 248, e.g. a first source/drain terminal, a second terminal 252, e.g. a second source/drain terminal, and a third terminal 254, e.g. a gate terminal.

First chip 204 may be in connection with second chip 224. First chip 204 may be in electrical connection with second chip 224. First chip 204 may be in electrical connection with second chip 224 via an electrically conducting interface 238.

Second terminal 212, e.g. second source/drain terminal 212 of transistor 206 formed in first chip 204, may be in electrical connection with first terminal 228, e.g. first source/drain terminal 228 of transistor 226 formed in second chip 224. Second terminal 232, e.g. second source/drain terminal 232 of transistor 226 formed in second chip 224 may be electrically connected to a first terminal of bulk capacitor 236. First terminal 208, e.g. first source/drain terminal 212 of transistor 206 formed in first chip 204, may be electrically connected to a second terminal of bulk capacitor 236.

A power supply 216 may be configured to supply a voltage ranging from about 85 V to about 265V to lamp ballast circuit 202. A first terminal of power supply 216 may be connected to a first terminal of a resistor 218. A second terminal of the resistor 218 may be connected to a first terminal 248 of a transistor 246 formed in third chip 244, and further connected to a first terminal of a diode 222. First terminal 248 of a transistor 246 may be connected to the first terminal of diode 222. Second terminal 252 of transistor 246 may be connected to a second terminal of power supply 216. A second terminal of diode 222 may be connected to a first terminal of a bulk capacitor 236. Second terminal 252 of transistor 246 may be connected to a second terminal of the bulk capacitor 236. Therefore, bulk capacitor 236 may be connected in parallel with transistor 246 and diode 222. The first terminal of diode 222 may include an input terminal of diode 222. The second terminal of diode 222 may include an output terminal of diode 222.

The second terminal of diode 222 and the first terminal of bulk capacitor 236 may be connected to second terminal 232 of transistor 226. Second terminal of bulk capacitor 236 and second terminal 252 of transistor 246 may be connected to first terminal 208 of transistor 206.

Electrically conducting interface 238 may be connected to a first terminal of further resistor 242 and a first terminal of capacitor 256. Second terminal of capacitor 256 may be connected to first terminal 208 of transistor 206. Second terminal of resistor 242 may be connected to a first terminal of further capacitor 258. Second terminal of further capacitor 258 may be connected to a first terminal of lamp 262. Second terminal of capacitor 256 may be connected to a second terminal of lamp 262.

Transistor 206 formed in first chip 204 may include a high-voltage transistor, e.g. a LightMOS™ 600V. Transistor 226 formed in first chip 224 may include a high-voltage transistor, e.g. a LightMOS™ 600V. Transistor 246 formed in third chip 244 may include a high-voltage transistor, e.g. a CoolMOS™ 500V.

Figure 3:
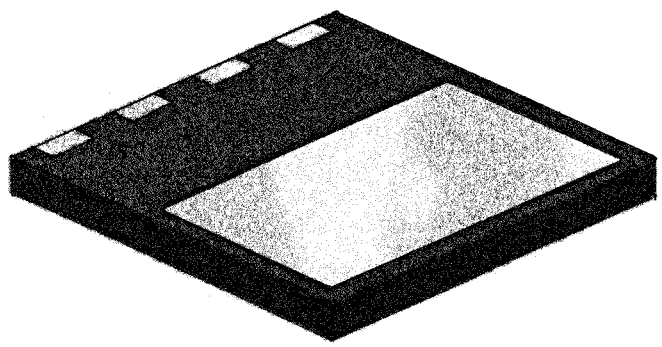
FIG. 3 shows a chip-housing module for a single chip.
Figure 3:
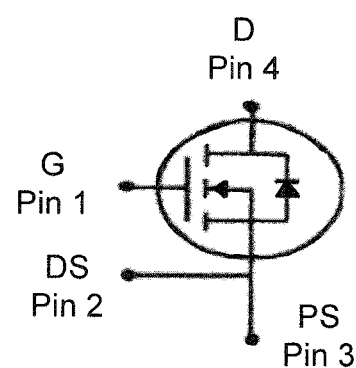

A plurality of high-voltage transistors, e.g. high-voltage power transistors, e.g. transistors 206, 226, 246 could not be housed in a chip-housing module, such as the chip-module shown in FIG. 3, which is only suitable for housing a single chip. Therefore, a chip-housing module, e.g. a multi-chip module, is needed to house a plurality of high-voltage chips. The chip-housing module, e.g. a multi-chip module, may be used to house at least part of a circuit including one or more high-voltage chips, e.g. power transistors, in electrical connection with each other. The chip-housing module may be used to house a plurality of transistors electrically connected to each other, e.g. electrically connected in a half-bridge configuration, e.g. electrically connected in a full-bridge configuration.

Figure 2B:
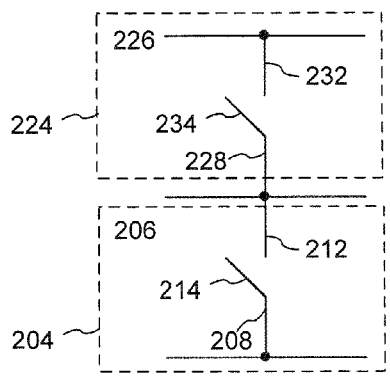
FIG. 2B shows a first high-voltage chip in electrical connection with a second high-voltage chip.

A chip-housing module, e.g. multi-chip module may be used to house at least part of a circuit, e.g. at least part of a lamp ballast circuit 202, the at least part of the circuit 202 including first chip 204 and second chip 224 electrically connected to each other, e.g. electrically connected in a half-bridge configuration, e.g. electrically connected in a full-bridge configuration, as shown in illustration 210 of FIG. 2B. A chip, e.g. first chip 204, e.g. second chip 224, may include a semiconductor chip. A chip, e.g. first chip 204, e.g. second chip 224 may include at least part of a transistor, e.g. at least part of a high-voltage transistor, e.g. at least part of a power transistor.

Figure 4A:
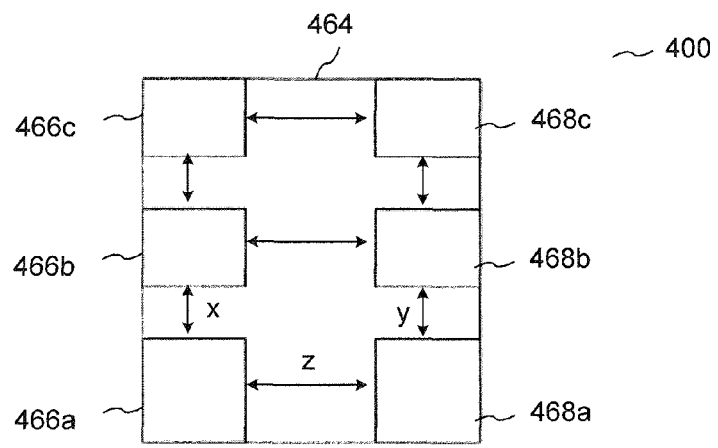
FIGS. 4A to 4G show a chip-housing module according to various embodiments.

FIG. 4A shows a chip-housing module 400 according to an embodiment. Chip-housing module 400 may include a carrier 464 configured to carry one or more chips, e.g. chip 204 and chip 224.

Carrier 464 may include a first plurality of openings 466a, 466b, 466c wherein each opening of the first plurality of openings 466a, 466b, 466c may be separated by a first pre-determined distance x, and may be configured to receive a chip connection for providing a voltage lying within a first range of voltage values to a chip.

Carrier may include a second plurality of openings 468a, 468b, 468c, wherein each opening of the second plurality of openings 468a, 468b, 468c may be separated by a second pre-determined distance y, and may be configured to receive a chip connection for providing a voltage lying within a second range of voltage values to a chip.

Chip-housing module 400 as described according to FIG. 4A may include a first and second plurality of openings 466a, 466b, 466c, 468a, 468b, 468c which may be configured to receive chip connections including at least part of a chip, e.g. chip 204, e.g. chip 244. A chip, e.g. chip 204, e.g. chip 244 may include at least one chip connection. A chip connection may include an electrically conductive element, e.g. an electrically conductive wire, e.g. an electrically conductive pin, e.g. an electrically conductive chip pad.

One or more of the first plurality of openings 466a, 466b, 466c and the second plurality of openings 468a, 468b, 468c may each be configured to receive a chip connection including at least one of an electrically conductive element, an electrically conductive wire, an electrically conductive wire, and an electrically conductive pin.

One or more of the first and second plurality of openings 466a, 466b, 466c, 468a, 468b, 468c may each be configured to receive a chip connection including at least part of a semiconductor power transistor.

A pair of openings consisting of one opening of the first plurality of openings 466a, 466b, 466c and one opening of the second plurality of openings 468a, 468b, 468c may be separated by a distance z different from at least one of the first pre-determined distance x and the second pre-determined distance y.

The distance z separating a pair of openings consisting of one opening of the first plurality of openings 466a, 466b, 466c and one opening of the second plurality of openings 468a, 468b, 468c may be larger than at least one of the first pre-determined distance x and the second pre-determined distance y, and the voltage values in the second range of voltage values are larger than the voltage values in the first range of voltage values by a pre-determined voltage value.

The pair of openings may include a plurality of pairs of openings, each pair of openings consisting of one opening of the first plurality of openings 466a, 466b, 466c and one opening of the second plurality of openings 468a, 468b, 468c separated by a distance z different from at least one of the first pre-determined distance x and the second pre-determined distance y.

The voltage values in the first range of voltage values may represent voltage values in a first voltage class. Therefore, each opening, e.g. opening 466a, opening 466b, and opening 466c, of a first plurality of openings 466a, 466b, 466c may be configured to receive a chip connection for providing a voltage lying within a first range of voltage values to a chip. The first range of voltage values may belong to a first voltage class with voltage values lying in the range from between about 0 V to less than about 100 V, e.g. from about 0 V to about 25 V, e.g. from about 0 V to about 30 V, e.g. from about 0 V to about 40 V, e.g. from about 0 V to about 60 V, e.g. from about 0 V to about 75 V, e.g. from about 0 V to about 100 V. The separation distance between each opening of the first plurality of openings 466a, 466b, 466c i.e. the first pre-determined distance, may be less than 1 mm if the voltages lying within the first range of voltage values differ by less than 100 V.

The voltage values in the second range of voltage values may represent voltage values in a second voltage class. Therefore, each opening, e.g. opening 468a, opening 468b, and opening 468c, of a second plurality of openings 468a, 468b, 468c may be configured to receive a chip connection for providing a voltage lying within a second range of voltage values to a chip. The second range of voltage values may belong to a second voltage class with voltage values larger than 150 V. The second range of voltage values may belong to a second voltage class with voltage values lying in the range from between about 150 V to less than about 1700 V, e.g. from about 150 V to about 200 V, e.g. from about 150 V to about 250 V, e.g. from about 150 V to about 300 V, e.g. from about 150 V to about 600 V, e.g. from about 150 V to about 650 V, e.g. from about 150 V to about 1700 V. The separation distance between each opening of the second plurality of openings 468a, 468b, 468c, i.e. the second pre-determined distance, may be less than about 1 mm if the voltages lying within the second range of voltage values differ by less than 100 V.

The first pre-determined distance x and the second pre-determined distance y may be equal. According to an alternative embodiment, the first pre-determined distance x may be different from the second pre-determined distance y. At least one of the first pre-determined distance x and second pre-determined distance y may be less than about 1 mm. Both the first pre-determined distance x and second pre-determined distance y may be less than about 1 mm.

The pre-determined voltage may represent a voltage difference between the first voltage class and the second voltage class. The pre-determined voltage value may be larger than 100 V, e.g. may be in the range from about 100 V to about 200 V. The pair of openings consisting of one opening of the first plurality of openings 466a, 466b, 466c for providing a voltage lying within a first range of voltage values, i.e. the first voltage class, and one opening of the second plurality of openings 468a, 468b, 468c for providing a voltage lying within a second range of voltage values, i.e. the second voltage class, may be separated by a distance greater than 2 mm, e.g. at a creepage distance of 2.7 mm.

Chip-housing module 400 may include a surface mount device (SMD) package, e.g. a power quad flat no leads (PQFN) package. Chip-housing module 400 may have an aspect ratio greater than 3:2. Chip-housing module 400 may have an aspect ratio greater than 2:1.

The carrier may include at least one from the following group of materials, the group consisting of: Cu, Ni, Fe, NiFe, Sn, S, P, e.g. less than 5% Sn, e.g. less than 5% S, e.g. less than 5% P.

Figure 4B:
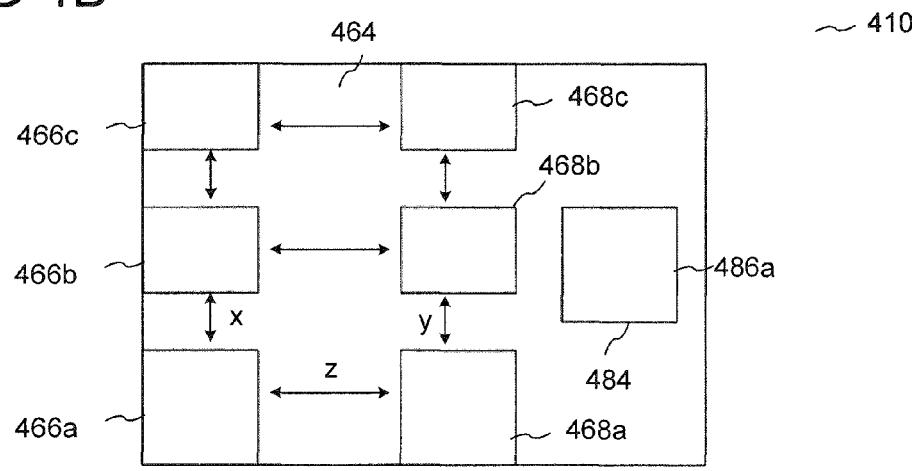

According to an embodiment, illustrated in the chip-housing module 410 of FIG. 4B, carrier 464 of chip-housing module 400 may be further configured to carry one or more components, 484 e.g. a driver integrated circuit.

The basic functionalities of the features described with respect to chip-housing module 400 are applicable to chip-housing module 410. Identical features as to those described with respect to chip-housing module 400 are denoted with the same reference signs.

Figure 4C:
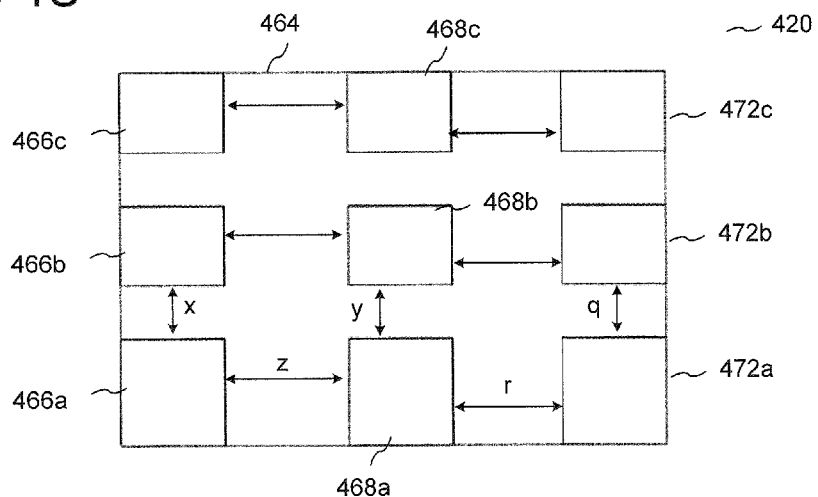

According to an embodiment illustrated in the chip-housing module 420 of FIG. 4C, carrier 464 of any of chip-housing module 400 and 410 may further include a third plurality of openings 472a, 472b, 472c, wherein each opening of the third plurality of openings 472a, 472b, 472c may be separated by a third pre-determined distance q, and may be configured to receive a chip connection for providing a voltage lying within a third range of voltage values to a chip.

A pair of openings consisting of one opening of the second plurality of openings 468a, 468b, 468c and one opening of the third plurality of openings 472a, 472b, 472c may be separated by a distance r different from at least one of the first pre-determined distance x, the second pre-determined distance y and the third pre-determined distance q.

The voltage values in the third range of voltage values may represent voltage values in a third voltage class. Therefore, each opening, e.g. opening 472a, opening 472b, and opening 472c of a third plurality of openings 472a, 472b, 472c may be configured to receive a chip connection for providing a voltage lying within a third range of voltage values to a chip. The third range of voltage values may belong to a third voltage class with voltage values larger than 150 V. The third range of voltage values may belong to a third voltage class with voltage values lying in the range from between about 150 V to less than about 1700 V, e.g. from about 150 V to about 200 V, e.g. from about 150 V to about 250 V, e.g. from about 150 V to about 300 V, e.g. from about 150 V to about 600 V, e.g. from about 150 V to about 650 V, e.g. from about 150 V to about 1700 V. The separation distance between each opening of the third plurality of openings 472a, 472b, 472c, i.e. the third pre-determined distance q, may be less than about 1 mm if the voltages lying within the third range of voltage values differ by less than 100 V.

The further pre-determined voltage may represent a voltage difference between the second voltage class and the third voltage class. The further pre-determined voltage value may be larger than 100 V, e.g. may be in the range from about 100 V to about 200 V. The pair of openings consisting of one opening of the second plurality of openings 468a, 468b, 468c for providing a voltage lying within a second range of voltage values, i.e. the second voltage class, and one opening of the third plurality of openings 472a, 472b, 472c for providing a voltage lying within a third range of voltage values, i.e. the third voltage class, may be separated by a distance greater than 2 mm, e.g. at a creepage distance of 2.7 mm.

The first plurality of openings 466a, 466b, 466c may include at least one opening 466a configured to receive a chip connection for providing a voltage lying within a first range of voltage values to a first chip 204; and the second plurality of openings 468a, 468b, 468c may include at least one opening 468a configured to receive a chip connection for providing a voltage lying within a second range of voltage values to a first chip 204, and at least one other opening 468b for providing a voltage lying within a second range of voltage values to a second chip 224.

The third plurality of openings 472a, 472b, 472c may include at least one opening 472a configured to receive a chip connection for providing a voltage lying within a third range of voltage values to a second chip 224.

The first plurality of openings 466a, 466b, 466c may include at least one opening 466a configured to receive a chip connection for providing a voltage lying within a first range of voltage values to a first source/drain terminal 208 of a transistor 206 formed in the first chip 204, and at least one other opening 466b configured to receive a chip connection for providing a voltage lying within a first range of voltage values to a gate terminal 214 of the transistor 206 formed in the first chip 204; and wherein the second plurality of openings 468a, 468b, 468c may include at least one opening 468a configured to receive a chip connection for providing a voltage lying within a second range of voltage values to a second source/drain terminal 212 of the transistor 206 formed in the first chip 204 and to a first source/drain terminal 228 of the transistor 226 formed in the second chip 224, and at least one other opening 468b for providing a voltage lying within a second range of voltage values to a gate terminal 234 of a transistor 226 formed in the second chip 224.

The third plurality of openings may include at least one opening 472a configured to receive a chip connection for providing a voltage lying within a third range of voltage values to a second source/drain terminal 232 of the transistor 226 formed in the second chip 224.

Each opening of the first plurality of openings 466a, 466b, 466c may be separated from an adjacent opening of the first plurality of openings 466a, 466b, 466c by a first pre-determined distance x. E.g. opening 466a may be separated from an adjacent opening 466b by a first pre-determined distance x, and opening 466b may be separated from an adjacent opening 466c by a first pre-determined distance x.

Each opening of the second plurality of openings 468a, 468b, 468c may be separated from an adjacent opening of the second plurality of openings 468a, 468b, 468c by a second pre-determined distance y. E.g. opening 468a may be separated from an adjacent opening 468b by a second pre-determined distance y, and opening 468b may be separated from an adjacent opening 468c by a second pre-determined distance y.

The pair of openings may include a pair of adjacent openings consisting of one opening of the first plurality of openings 466a, 466b, 466c and one opening of the second plurality of openings 468a, 468b, 468c, and may be separated by a distance different z from at least one of the first pre-determined distance x and the second pre-determined distance y. E.g. opening 466a of the first plurality of openings 466a, 466b, 466c and opening 468a of the second plurality of openings 468a, 468b, 468c may be adjacent and may be separated by a distance z different from at least one of the first pre-determined distance x and the second pre-determined distance y, e.g. opening 466b of the first plurality of openings 466a, 466b, 466c and opening 468b of the second plurality of openings 468a, 468b, 468c may be adjacent and may be separated by a distance z different from at least one of the first pre-determined distance x and the second pre-determined distance y.

The distance separating a pair of adjacent openings consisting of one opening 466a of the first plurality of openings 466a, 466b, 466c and one opening 468a of the second plurality of openings 468a, 468b, 468c may be larger than at least one of the first pre-determined distance x and the second pre-determined distance, and the voltage values in the second range of voltage values are larger than the voltage values in the first range of voltage values by a pre-determined voltage value.

The distance r separating a pair of adjacent openings consisting of one opening 468a of the second plurality of openings 468a, 468b, 468c and at least one opening 472a of the third plurality of openings 472a, 472b, 472c may be different from at least one of the first pre-determined distance x, the second pre-determined distance y and the third pre-determined distance q.

The distance r separating a pair of adjacent openings consisting of one opening 468a of the second plurality of openings 468a, 468b, 468c and at least one opening 472a of the third plurality of openings 472a, 472b, 472c may be larger than at least one of the first pre-determined distance x, the second pre-determined distance y, and the third pre-determined distance q, when the voltage values in the third range of voltage values are larger than the voltage values in the first range of voltage values or second range of voltage values by the further pre-determined voltage value, e.g. the further pre-determined voltage value may be in the range from about 100 V to about 200 V. The further pre-determined voltage value may be different from the pre-determined voltage value. The further pre-determined voltage value may be equal to the pre-determined voltage value.

The basic functionalities of the features described with respect to chip-housing module 400, 410, and 420 are applicable to chip-housing module 430 described below. Identical features as to those described with respect to chip-housing module 400, 410 and 420 are denoted with the same reference signs.

Figure 4D:
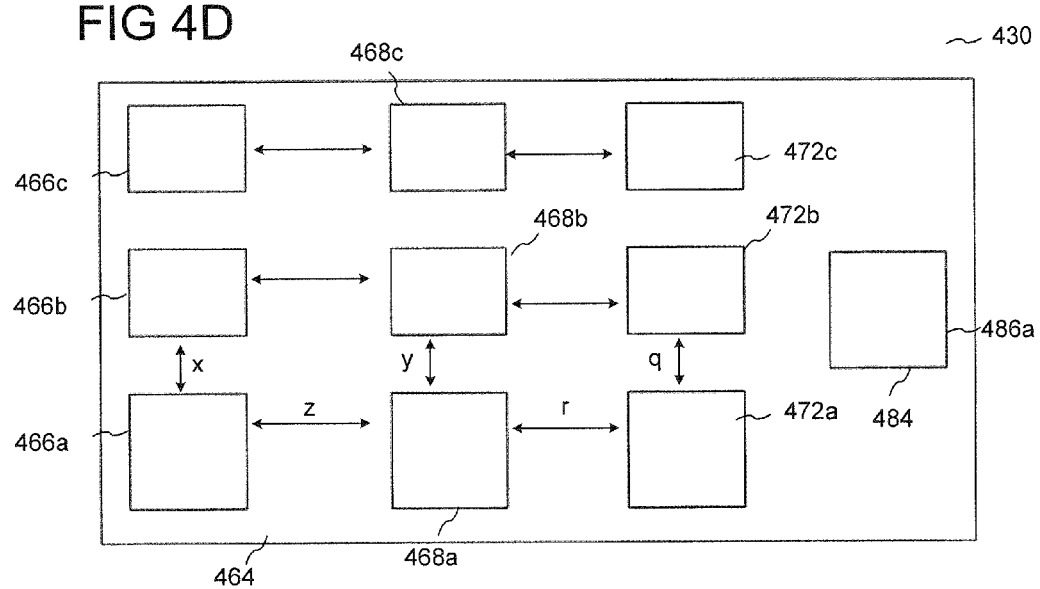

According to an embodiment as illustrated in the chip-housing module 430 of FIG. 4D, carrier 464 of any of chip-housing modules 400, 410 and 420 may be further configured to carry one or more components 484, e.g. a driver integrated circuit.

Figure 4E:
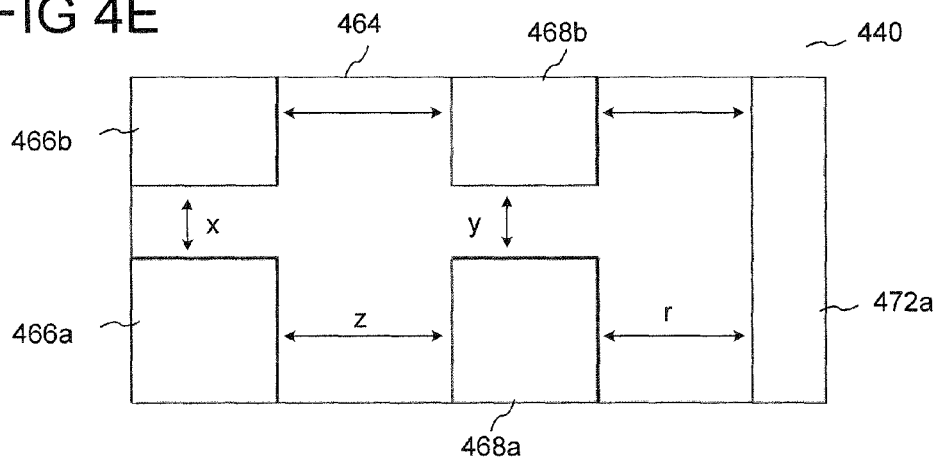

According to an embodiment as illustrated in the chip-housing module 440 of FIG. 4E, any of chip-housing modules 400, 410 420 and 430 may include a single third opening 472a instead of third plurality of openings 472a, 472b, 472c.

Third opening 472a may be configured to receive a chip connection for providing a voltage lying within a third range of voltage values to a chip; wherein a pair of adjacent openings consisting of one opening of the second plurality of openings and the third opening 472a may be separated by a distance r different from at least one of the first pre-determined distance x and the second pre-determined distance y, e.g. wherein a pair of adjacent openings consisting of one opening 468a of the second plurality of openings and the third opening 472a may be separated by a distance r different from at least one of the first pre-determined distance x and the second pre-determined distance y. Third opening 472a may be configured to receive a chip connection for providing a voltage lying within a third range of voltage values to second chip 224. The functionalities of the feature, opening 472a, and the basic functionalities of the other features described with respect to chip-housing module 400, 410, 420 and 430, are applicable to chip-housing module 440. Identical features as to those described with respect to chip-housing module 420 and 430, are denoted with the same reference signs.

Figure 4F:
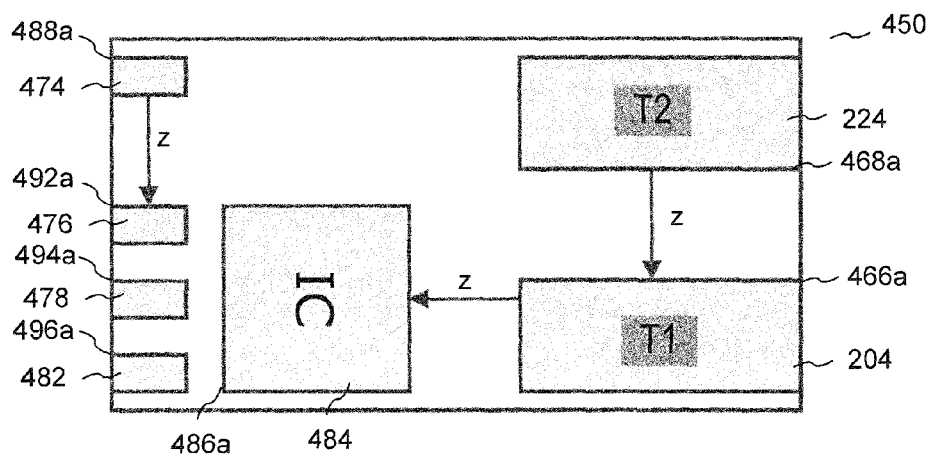
Figure 4G:
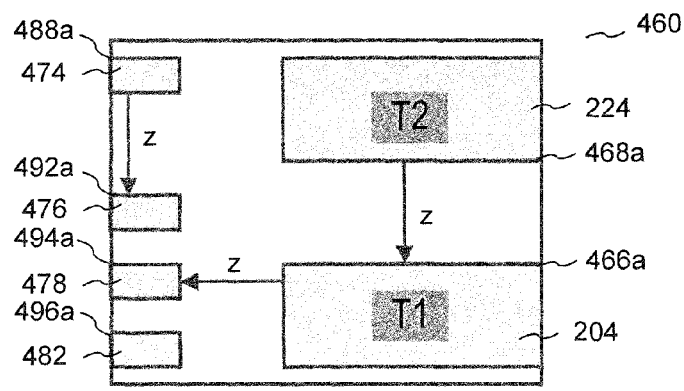

According to an embodiment as illustrated in the chip-housing module 450 of FIG. 4F, any of chip-housing modules 400, 410, 420, and 430 may include a carrier 464 configured to carry one or more chips, e.g. chip 204 and chip 224.

Carrier 464 may include a first plurality of openings wherein each opening of the first plurality of openings may be separated by a first pre-determined distance (not shown), and may be configured to receive a chip connection for providing a voltage lying within a first range of voltage values to a chip.

The carrier may include a second plurality of openings, wherein each opening of the second plurality of openings may be separated by a second pre-determined distance (not shown), and may be configured to receive a chip connection for providing a voltage lying within a second range of voltage values to a chip.

A pair of openings consisting of one opening 466a of the first plurality of openings and one opening 468b of the second plurality of openings may be separated by a distance z, wherein z may be a distance equal to or larger than a creepage distance, e.g. a minimum distance between an electrical connection in one opening of the first plurality of openings and an electrical connection in one opening of the second plurality of openings, to prevent long term degradation of the surface of the carrier 464.

Carrier 464 may be further configured to carry one or more components, 474 e.g. a electrical connection for a supply voltage, components 476 and 478, e.g. external terminals for providing a control voltage, e.g. an external ground terminal 482. Carrier 464 may include at least one opening 488a to receive a electrical connection for providing a supply voltage 474. Carrier 464 may include one or more openings 492a, 494a to each receive a electrical connection for providing a control voltage 476 and 478. Carrier 464 may include at least one opening 496a to receive a electrical connection for providing an external ground voltage 482.

A pair of openings consisting of one opening 488a configured to receive a chip connection configured to receive a electrical connection for providing a supply voltage 474 and an opening 492a configured to receive a electrical connection for providing a control voltage 476, may be separated by the distance z.

A pair of openings consisting of one opening 466a of the first plurality of openings and an opening 494a configured to receive a electrical connection for providing a control voltage 478, may be separated by the distance z.

The opening 466a, i.e the at least one opening 466a of the first plurality of openings 466a, 466b, 466c may be configured to receive a electrical connection from a chip, e.g. a first chip 204, wherein the electrical connection received by opening 466a may include the back side of the chip e.g. a drain region of a power transistor of a chip. Opening 468b, the at least one opening 468a of the second plurality of openings 466a, 466b, 466c, 466c may be configured to receive a electrical connection from a chip, e.g. a second chip 224, wherein the electrical connection received by opening 468a may include the back side of the chip, e.g. a drain region of a power transistor of a chip. An electrically conductive connection, e.g. a terminal electrically connected to each of components 474, 476 478, 482 received by openings 488a, 492a, 494a, 496a may include an electrically conductive element, e.g. an electrically conductive wire, e.g. an electrically conductive pin, e.g. an electrically conductive chip pad.

According to an embodiment as illustrated in the chip-housing module 460 of FIG. 4F, carrier 464 of any of chip-housing modules 400, 410 420, 430, 440 and 450 may be further configured to carry one or more components, 484 e.g. a driver integrated circuit. Carrier 464 may include one or more openings 486a configured to receive a chip connection for providing a voltage to the one or more components, 484 e.g. a driver integrated circuit. A pair of openings consisting of one opening 486a configured to receive a chip connection for providing a voltage to the one or more components, 484 and one opening 466a of the first plurality of openings may be separated by the distance z. A pair of openings consisting of one opening 486a configured to receive a chip connection for providing a voltage to the one or more components, 484 and one opening 468a of the second plurality of openings may be separated by the distance z (not shown).

According to an embodiment, carrier 464 of any of chip-housing modules 400, 410 420, 430, 440, 450 an 460 may be configured to carry a first chip 204, a second chip 224, one or more components 484, 474, 476, 478, 482 electrically connected to form a circuit. Carrier 464 may be configured to include a plurality of openings each configured to receive an electrical connection for providing a voltage to first chip 204, second chip 224, and the one or more components 484, 474, 476, 478, 482. One or more adjacent openings are separated by the minimum distance z, such that when the difference in voltage provided by adjacent electrical connections to the circuit exceeds a pre-determined voltage, the electrical connections are separated by at least the minimum distance z. The plurality of openings may be of different sizes depending on the size of the voltage provided by each terminal received by the opening. Therefore, an opening receiving an electrical connection, e.g. an electrically conductive pin, an electrically conductive wire, an electrically conductive pin, providing a voltage lying within the range of a lower voltage class, may be smaller than an opening receiving a terminal, e.g. drain region at the back of a chip, providing a voltage lying within the range of a higher voltage class.

According to an embodiment, carrier 464 may be formed from two thinpak 6×5 chip-housing modules which remain connected at one package-edge during package-singulation with e.g. sawing.

A method for forming a chip-housing module according to various embodiments is disclosed in illustration 500 of FIG. 5, the method including (in 510):

forming a carrier for carrying one or more chips;
the carrier including a first plurality of openings, wherein each opening of the first plurality of openings is separated by a first pre-determined distance, and is capable of receiving a chip connection for providing a voltage lying within a first range of voltage values to a chip;

the carrier including a second plurality of openings, wherein each opening of the second plurality of openings is separated by the second pre-determined distance, and is capable of receiving a chip connection for providing a voltage lying within a second range of voltage values to a chip; and wherein a pair of openings consisting of one opening of the first plurality of openings and one opening of the second plurality of openings is separated by a distance different from at least one of the first pre-determined distance and the second pre-determined distance.

A chip-housing module according to various embodiments is disclosed, the chip-housing module, including a carrier configured to carry one or more chips; the carrier including a first plurality of openings, wherein each opening of the first plurality of openings is separated by a first pre-determined distance, and is configured to receive a chip connection for providing a voltage lying within a first range of voltage values to a chip; the carrier including a second plurality of openings, wherein each opening of the second plurality of openings is separated by a second pre-determined distance, and is configured to receive a chip connection for providing a voltage lying within a second range of voltage values to a chip; and wherein a pair of openings consisting of one opening of the first plurality of openings and one opening of the second plurality of openings is separated by a distance different from at least one of the first pre-determined distance and the second pre-determined distance.

According to an embodiment, the distance separating a pair of openings consisting of one opening of the first plurality of openings and one opening of the second plurality of openings is larger than at least one of the first pre-determined distance and the second pre-determined distance, and the voltage values in the second range of voltage values are larger than the voltage values in the first range of voltage values by a pre-determined voltage value.

According to an embodiment, the pre-determined voltage value may be in the range from about 100 V to about 200 V.

According to an embodiment, the pair includes a plurality of pairs of openings consisting of one opening of the first plurality of openings and one opening of the second plurality of openings separated by a distance different from at least one of the first pre-determined distance and the second pre-determined distance.

According to an embodiment, the first plurality of openings includes at least one opening configured to receive a chip connection for providing a voltage lying within a first range of voltage values to a first chip; and wherein the second plurality of openings includes at least one opening configured to receive a chip connection for providing a voltage lying within a second range of voltage values to a first chip, and at least one other opening for providing a voltage lying within a second range of voltage values to a second chip.

According to an embodiment, the carrier further includes a third opening configured to receive a chip connection for providing a voltage lying within a third range of voltage values to a chip; wherein a pair of openings consisting of one opening of the second plurality of openings and the third opening is separated by a distance different from at least one of the first pre-determined distance, the second pre-determined distance.

According to an embodiment, the third opening is configured to receive a chip connection for providing a voltage lying within a third range of voltage values to a second chip.

According to an embodiment, the carrier further includes a third plurality of openings, wherein each opening of the third plurality of openings is separated by a third pre-determined distance, and is configured to receive a chip connection for providing a voltage lying within a third range of voltage values to a chip; wherein a pair of openings consisting of one opening of the second plurality of openings and one opening of the third plurality of openings is separated by a distance different from at least one of the first pre-determined distance, the second pre-determined distance and the third pre-determined distance.

According to an embodiment, the third plurality of openings includes at least one opening configured to receive a chip connection for providing a voltage lying within a third range of voltage values to a second chip.

According to an embodiment, the first plurality of openings includes at least one opening configured to receive a chip connection for providing a voltage lying within a first range of voltage values to a first source/drain terminal of a transistor formed in the first chip, and at least one other opening configured to receive a chip connection for providing a voltage lying within a first range of voltage values to a gate terminal of the transistor formed in the first chip; and wherein the second plurality of openings includes at least one opening configured to receive a chip connection for providing a voltage lying within a second range of voltage values to a second source/drain terminal of the transistor formed in the first chip and to a first source/drain terminal of the transistor formed in the second chip, and at least one other opening for providing a voltage lying within a second range of voltage values to a gate terminal of a transistor formed in the second chip.

According to an embodiment, a third opening includes at least one opening configured to receive a chip connection for providing a voltage lying within a third range of voltage values to a second source/drain terminal of the transistor formed in the second chip.

According to an embodiment, a third plurality of openings includes at least one opening configured to receive a chip connection for providing a voltage lying within a third range of voltage values to a second source/drain terminal of the transistor formed in the second chip.

According to an embodiment, the first and second plurality of openings may be configured to receive chip connections including electrically conductive pins.

According to an embodiment, the first and second plurality of openings may be configured to receive chip connections including at least part of a semiconductor chip.

According to an embodiment, the first and second plurality of openings may be configured to receive chip connections including at least part of a semiconductor power transistor.

According to an embodiment, at least one of the first pre-determined distance and second pre-determined distance is about 1 mm.

According to an embodiment, the pair of openings consisting of one opening of the first plurality of openings and one opening of the second plurality of openings is separated by a distance greater than 2 mm.

According to an embodiment, the voltage values of the first voltage range lie from between about 0 V to 100 V.

According to an embodiment, the voltage values of the second voltage range are larger than 150 V.

According to an embodiment, the voltage values of the third voltage range are larger than 150 V.

According to an embodiment, the carrier includes at least one from the following group of materials, the group consisting of: Cu, Ni, Fe, NiFe, Sn, S, P.

According to an embodiment, the carrier is further configured to carry a driver integrated circuit.

Various embodiments illustratively provide design rules for chip-housing modules for a plurality of high-voltage chips, e.g. surface mount devices, particularly for the distance separation between voltage terminals of high-voltage chips. The distance between an opening for providing a high voltage to a chip and an opening for providing a low voltage to a chip is larger than the distance between an opening for providing a low voltage to a chip and another opening for providing a low voltage to a chip.

The chip-housing multichip-module, e.g. a multichip-module for HV-half-bridge, increases the integrations density of the circuit. Furthermore, as the optimal creepage distance of the contacts for the high-voltage multi-chip module has been provided for, creepage spacing, e.g minimal spacing between two conductive contacts, need no longer be considered.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip-housing module, comprising
a carrier configured to carry one or more chips;
the carrier comprising a first plurality of openings, wherein each opening of the first plurality of openings is separated by a first pre-determined distance, and is configured to receive a chip connection for providing a voltage lying within a first range of voltage values to a chip;
the carrier comprising a second plurality of openings, wherein each opening of the second plurality of openings is separated by a second pre-determined distance, and is configured to receive a chip connection for providing a voltage lying within a second range of voltage values to a chip; and
wherein a pair of openings consisting of one opening of the first plurality of openings and one opening of the second plurality of openings is separated by a distance different from at least one of the first pre-determined distance and the second pre-determined distance.

2. The chip-housing module of claim 1,
wherein the distance separating a pair of openings consisting of one opening of the first plurality of openings and one opening of the second plurality of openings is larger than at least one of the first pre-determined distance and the second pre-determined distance, and the voltage values in the second range of voltage values are larger than the voltage values in the first range of voltage values by a pre-determined voltage value.

3. The chip-housing module of claim 2,
wherein the pre-determined voltage value may be in the range from about 100 V to about 200 V.

4. The chip-housing module of claim 1,
wherein the pair comprises a plurality of pairs of openings consisting of one opening of the first plurality of openings and one opening of the second plurality of openings separated by a distance different from at least one of the first pre-determined distance and the second pre-determined distance.

5. The chip-housing module of claim 1,
wherein the first plurality of openings comprises at least one opening configured to receive a chip connection for providing a voltage lying within a first range of voltage values to a first chip; and
wherein the second plurality of openings comprises at least one opening configured to receive a chip connection for providing a voltage lying within a second range of voltage values to a first chip, and at least one other opening for providing a voltage lying within a second range of voltage values to a second chip.

6. The chip-housing module of claim 1,
wherein the carrier further comprises
a third opening configured to receive a chip connection for providing a voltage lying within a third range of voltage values to a chip;
wherein a pair of openings consisting of one opening of the second plurality of openings and the third opening is separated by a distance different from at least one of the first pre-determined distance, the second pre-determined distance.

7. The chip-housing module of claim 6,
wherein the third opening is configured to receive a chip connection for providing a voltage lying within a third range of voltage values to a second chip.

8. The chip-housing module of claim 6,
wherein the voltage values of the third voltage range are larger than 150 V.

9. The chip-housing module of claim 1,
wherein the carrier further comprises
a third plurality of openings, wherein each opening of the third plurality of openings is separated by a third pre-determined distance, and is configured to receive a chip connection for providing a voltage lying within a third range of voltage values to a chip;
wherein a pair of openings consisting of one opening of the second plurality of openings and one opening of the third plurality of openings is separated by a distance different from at least one of the first pre-determined distance, the second pre-determined distance and the third pre-determined distance.

10. The chip-housing module of claim 9,
wherein the third plurality of openings comprises at least one opening configured to receive a chip connection for providing a voltage lying within a third range of voltage values to a second chip.

11. The chip-housing module of claim 1,
wherein the first plurality of openings comprises at least one opening configured to receive a chip connection for providing a voltage lying within a first range of voltage values to a first source/drain terminal of a transistor formed in the first chip, and at least one other opening configured to receive a chip connection for providing a voltage lying within a first range of voltage values to a gate terminal of the transistor formed in the first chip; and
wherein the second plurality of openings comprises at least one opening configured to receive a chip connection for providing a voltage lying within a second range of voltage values to a second source/drain terminal of the transistor formed in the first chip and to a first source/drain terminal of the transistor formed in the second chip, and at least one other opening for providing a voltage lying within a second range of voltage values to a gate terminal of a transistor formed in the second chip.

12. The chip-housing module of claim 11,
wherein a third opening comprises at least one opening configured to receive a chip connection for providing a voltage lying within a third range of voltage values to a second source/drain terminal of the transistor formed in the second chip.

13. The chip-housing module of claim 11,
wherein a third plurality of openings comprises at least one opening configured to receive a chip connection for providing a voltage lying within a third range of voltage values to a second source/drain terminal of the transistor formed in the second chip.

14. The chip-housing module of claim 1,
wherein the first and second plurality of openings may be configured to receive chip connections comprising electrically conductive pins.

15. The chip-housing module of claim 1,
wherein the first and second plurality of openings may be configured to receive chip connections comprising at least part of a semiconductor chip.

16. The chip-housing module of claim 1,
wherein the first and second plurality of openings may be configured to receive chip connections comprising at least part of a semiconductor power transistor.

17. The chip-housing module of claim 1,
wherein at least one of the first pre-determined distance and second pre-determined distance is about 1 mm.

18. The chip-housing module of claim 1,
wherein the pair of openings consisting of one opening of the first plurality of openings and one opening of the second plurality of openings is separated by a distance greater than 2 mm.

19. The chip-housing module of claim 1,
wherein the voltage values of the first voltage range lie from between about 0 V to 100 V.

20. The chip-housing module of claim 1,
wherein the voltage values of the second voltage range are larger than 150 V.

21. The chip-housing module of claim 1,
wherein the carrier comprises at least one from the following group of materials, the group consisting of: Cu, Ni, Fe, NiFe, Sn, S, P.

22. The chip-housing module of claim 1,
wherein the carrier is further configured to carry a driver integrated circuit.

\* \* \* \* \*